United States Patent
Hunt

(10) Patent No.: US 7,813,176 B2
(45) Date of Patent: Oct. 12, 2010

(54) METHOD AND SYSTEM FOR UPDATING A STORED DATA VALUE IN A NON-VOLATILE MEMORY

(75) Inventor: Stephen Gregory Hunt, Darfield (NZ)

(73) Assignee: ARC Innovations Limited, Wellington (NZ)

( * ) Notice: Subject to any disclaimer, the term of this patent is extended or adjusted under 35 U.S.C. 154(b) by 311 days.

(21) Appl. No.: 12/132,510

(22) Filed: Jun. 3, 2008

(65) Prior Publication Data

US 2009/0091977 A1    Apr. 9, 2009

(30) Foreign Application Priority Data

Oct. 4, 2007    (NZ) .................................... 562200

(51) Int. Cl.
*G11C 14/00* (2006.01)
(52) U.S. Cl. .................. 365/185.08; 365/185.27; 365/185.28; 365/189.07
(58) Field of Classification Search ............ 365/185.08, 365/185.27, 185.28, 189.07
See application file for complete search history.

(56) References Cited

U.S. PATENT DOCUMENTS

| | | | |
|---|---|---|---|
| 5,010,568 A | 4/1991 | Merriam et al. | |
| 5,056,107 A | 10/1991 | Johnson et al. | |
| 5,161,182 A | 11/1992 | Merriam et al. | |
| 5,179,376 A | 1/1993 | Pomatto | |
| 5,239,575 A | 8/1993 | White et al. | |
| 5,293,115 A | 3/1994 | Swanson | |
| 5,311,581 A | 5/1994 | Merriam et al. | |
| 5,422,565 A | 6/1995 | Swanson | |
| 5,467,287 A | 11/1995 | Wenner et al. | |
| 5,469,365 A | 11/1995 | Diekema et al. | |
| 5,473,322 A | 12/1995 | Carney | |
| 5,488,565 A | 1/1996 | Kennon et al. | |
| 5,493,287 A | 2/1996 | Bane | |
| 5,523,559 A | 6/1996 | Swanson | |
| 5,617,084 A | 4/1997 | Sears | |
| 5,621,397 A | 4/1997 | Mutch et al. | |
| 5,664,202 A | 9/1997 | Chen et al. | |
| 5,852,658 A | 12/1998 | Knight et al. | |
| 5,897,607 A | 4/1999 | Jenney et al. | |
| 5,898,387 A | 4/1999 | Davis et al. | |
| 5,940,009 A | 8/1999 | Loy et al. | |
| 5,995,022 A | 11/1999 | Plis et al. | |
| 6,028,522 A | 2/2000 | Petite | |
| 6,088,659 A | 7/2000 | Kelley et al. | |
| 6,118,269 A | 9/2000 | Davis | |
| 6,218,953 B1 | 4/2001 | Petite | |

(Continued)

FOREIGN PATENT DOCUMENTS

JP    2001-092713 A    4/2001

*Primary Examiner*—Hoai V Ho
(74) *Attorney, Agent, or Firm*—Townsend and Townsend and Crew LLP

(57) ABSTRACT

The invention provides a method of updating a stored data value in a non-volatile memory. The method includes reading the stored data value from the non-volatile memory; reading a stored differential value from a volatile memory; receiving an updated data value; calculating a calculated differential value from the difference between the updated data value and the sum of the stored data value and the stored differential value; comparing the calculated differential value with a threshold differential value; and writing the updated data value to the non-volatile memory if the calculated differential value exceeds the threshold differential value. The invention further provides a related memory system.

6 Claims, 3 Drawing Sheets

U.S. PATENT DOCUMENTS

| | | |
|---|---|---|
| 6,232,886 B1 | 5/2001 | Morand |
| 6,243,693 B1 | 6/2001 | Richards |
| 6,351,223 B1 | 2/2002 | DeWeerd et al. |
| 6,362,745 B1 | 3/2002 | Davis |
| 6,380,852 B1 | 4/2002 | Hartman et al. |
| 6,401,081 B1 | 6/2002 | Montgomery et al. |
| 6,437,692 B1 | 8/2002 | Petite et al. |
| 6,538,577 B1 | 3/2003 | Ehrke et al. |
| 6,801,865 B2 | 10/2004 | Gilgenbach et al. |
| 6,819,098 B2 | 11/2004 | Villicana et al. |
| 6,842,706 B1 | 1/2005 | Baraty |
| 6,900,737 B1 | 5/2005 | Ardalan et al. |
| 6,954,814 B1 | 10/2005 | Leach |
| 6,980,973 B1 | 12/2005 | Karpenko |
| 7,020,566 B2 | 3/2006 | Villicana et al. |
| 7,049,932 B2 | 5/2006 | French et al. |
| 7,053,767 B2 | 5/2006 | Petite et al. |
| 7,085,161 B2 * | 8/2006 | Chen et al. ............. 365/185.17 |
| 7,088,239 B2 | 8/2006 | Basinger et al. |
| 7,091,818 B2 | 8/2006 | Nuutinen |
| 7,102,533 B2 | 9/2006 | Kim |
| 7,146,285 B2 * | 12/2006 | Wheless et al. ............. 702/120 |
| 7,184,904 B2 | 2/2007 | Kagan |
| 7,185,131 B2 | 2/2007 | Leach |
| 7,228,726 B2 | 6/2007 | Kates |
| 7,231,482 B2 | 6/2007 | Leach |
| 7,236,897 B2 | 6/2007 | Gandhi |
| 7,256,709 B2 | 8/2007 | Kagan |
| 7,262,709 B2 | 8/2007 | Borleske et al. |
| 7,304,587 B2 | 12/2007 | Boaz |
| 7,327,998 B2 | 2/2008 | Kumar et al. |
| 7,336,200 B2 | 2/2008 | Osterloh et al. |
| 7,362,232 B2 | 4/2008 | Holle et al. |
| 7,362,236 B2 | 4/2008 | Hoiness |
| 7,379,791 B2 | 5/2008 | Tamarkin et al. |
| 7,649,782 B2 * | 1/2010 | Eguchi et al. .......... 365/185.22 |
| 2003/0063723 A1 | 4/2003 | Booth et al. |
| 2003/0167178 A1 | 9/2003 | Jarman et al. |
| 2005/0105703 A1 | 5/2005 | Baraty |
| 2005/0134430 A1 | 6/2005 | French et al. |
| 2005/0240315 A1 | 10/2005 | Booth et al. |
| 2006/0055513 A1 | 3/2006 | French et al. |
| 2006/0129497 A1 | 6/2006 | Baraty |
| 2006/0129498 A1 | 6/2006 | Baraty |
| 2007/0103335 A1 | 5/2007 | Fitzgerald et al. |
| 2007/0247789 A1 | 10/2007 | Benson et al. |
| 2008/0042871 A1 | 2/2008 | Donaghey et al. |
| 2008/0126724 A1 | 5/2008 | Danilak |

* cited by examiner

METHOD AND SYSTEM FOR UPDATING A STORED DATA VALUE IN A NON-VOLATILE MEMORY

FIELD OF INVENTION

The invention relates to a method of updating a stored data value in a non-volatile memory. The invention further relates to a system configured to update a stored data value in a non-volatile memory.

BACKGROUND TO INVENTION

Non-volatile memory technology products such as EEPROM and FLASH are relatively cheap and commonly used in embedded systems that require data to be preserved when the power is turned off.

One disadvantage of non-volatile memory is that it is relatively slow to write to. A further disadvantage is that non-volatile memory has a limited life that is defined by the number of times a non-volatile memory location can be written to.

Due to its construction, the solid state gate cells of FLASH MEMORY or EEPROM can only tolerate a maximum number of write/erase cycles. This is typically 100,000 cycles maximum for 4 k bytes of EEPROM. This predictable failure mode is a major lifetime-limiting factor for EEPROM/FLASH MEMORY used in devices that have many write/erase cycles.

Although economical and stable devices, FLASH MEMORY and EEPROM can clearly become a risk factor and be unsuitable in applications where large amounts of data are stored, or where the data is frequently updated.

It is an object of at least preferred embodiments of the present invention to address the foregoing problems or at least to provide the public with a useful choice.

SUMMARY OF THE INVENTION

In broad terms in one form the invention provides a method of updating a stored data value in a non-volatile memory, the method comprising: reading the stored data value from the non-volatile memory; reading a stored differential value from a volatile memory; receiving an updated data value; calculating a calculated differential value from the difference between the updated data value and the sum of the current data value and the stored differential value; comparing the calculated differential value with a threshold differential value; and writing the updated data value to the non-volatile memory if the calculated differential value exceeds the threshold differential value.

As used herein the term "(s)" following a noun means the plural and/or singular form of that noun.

As used herein the term "and/or" means "and" or "or", or where the context allows both.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting.

The invention consists in the foregoing and also envisages constructions of which the following gives examples only.

BRIEF DESCRIPTION OF THE FIGURES

Preferred forms of the method and system for updating the stored data value in a non-volatile memory will now be described with reference to the accompanying figures in which.

DETAILED DESCRIPTION OF PREFERRED FORMS

Figure 1:
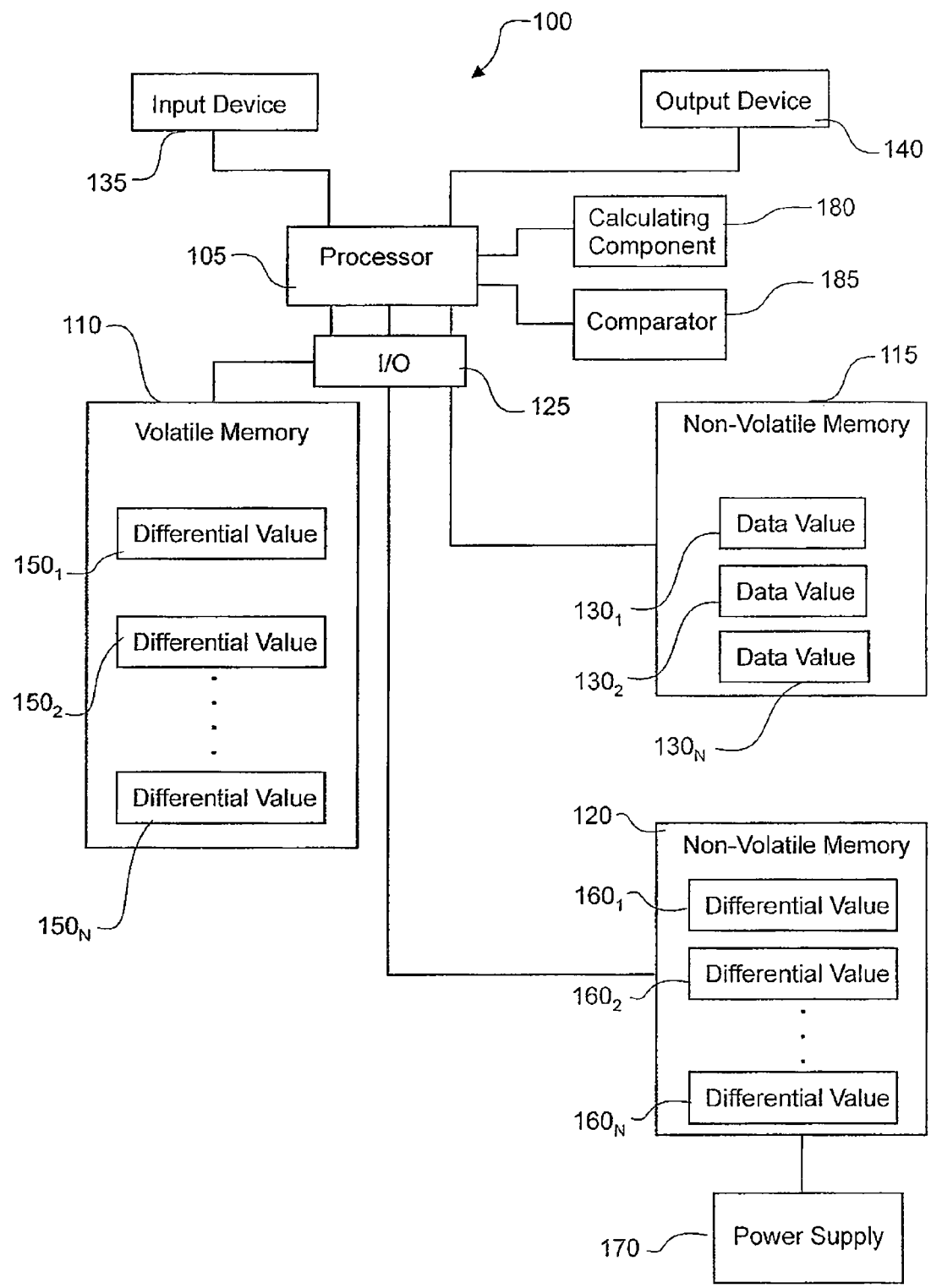
FIG. 1 shows a block diagram of the system in which one form of the invention may be implemented.

FIG. 1 illustrates a block diagram of the preferred form system 100 in which one form of the present invention may be implemented.

System 100 includes a processor 105. The processor 105 is interfaced to volatile memory 110, non-volatile memory 115 and secondary non-volatile memory 120. An I/O component 125 is configured to read data from and write data to volatile memory 110, non-volatile memory 115 and secondary non-volatile memory 120.

Stored in non-volatile memory 115 are a plurality of data values $130_{1\ldots N}$. Non-volatile memory 115 is a typical EEPROM or FLASH MEMORY. Data values 130 stored on non-volatile memory 115 are required to be maintained when power to the system 100 is turned off.

The system 105 receives updated data values through input device 135 and optionally outputs data values through output device 140. As new data values are received through input device 135 that correspond to respective data values 130, rather than simply replace the new data value 130 in non-volatile memory, the processor instead calculates a differential value at least partly from the updated data value, and the data value stored in the non-volatile memory 115. The system then stores a plurality of differential values $150_{1\ldots N}$ in volatile memory 110. Respective differential values 150 each correspond to respective data values 130. The data values and differential values are described in more detail below.

Prior to power interruption to the system 100, differential values 150 stored on volatile memory 110 are written to the secondary non-volatile memory 120 as differential values $160_{1\ldots N}$. It is envisaged that non-volatile memory 120 has a secondary power supply 170 to ensure that data in non-volatile memory 120 is not lost.

Software implemented components such as calculating component 180 and comparator 185 function in a manner more particularly described below.

Figure 2:
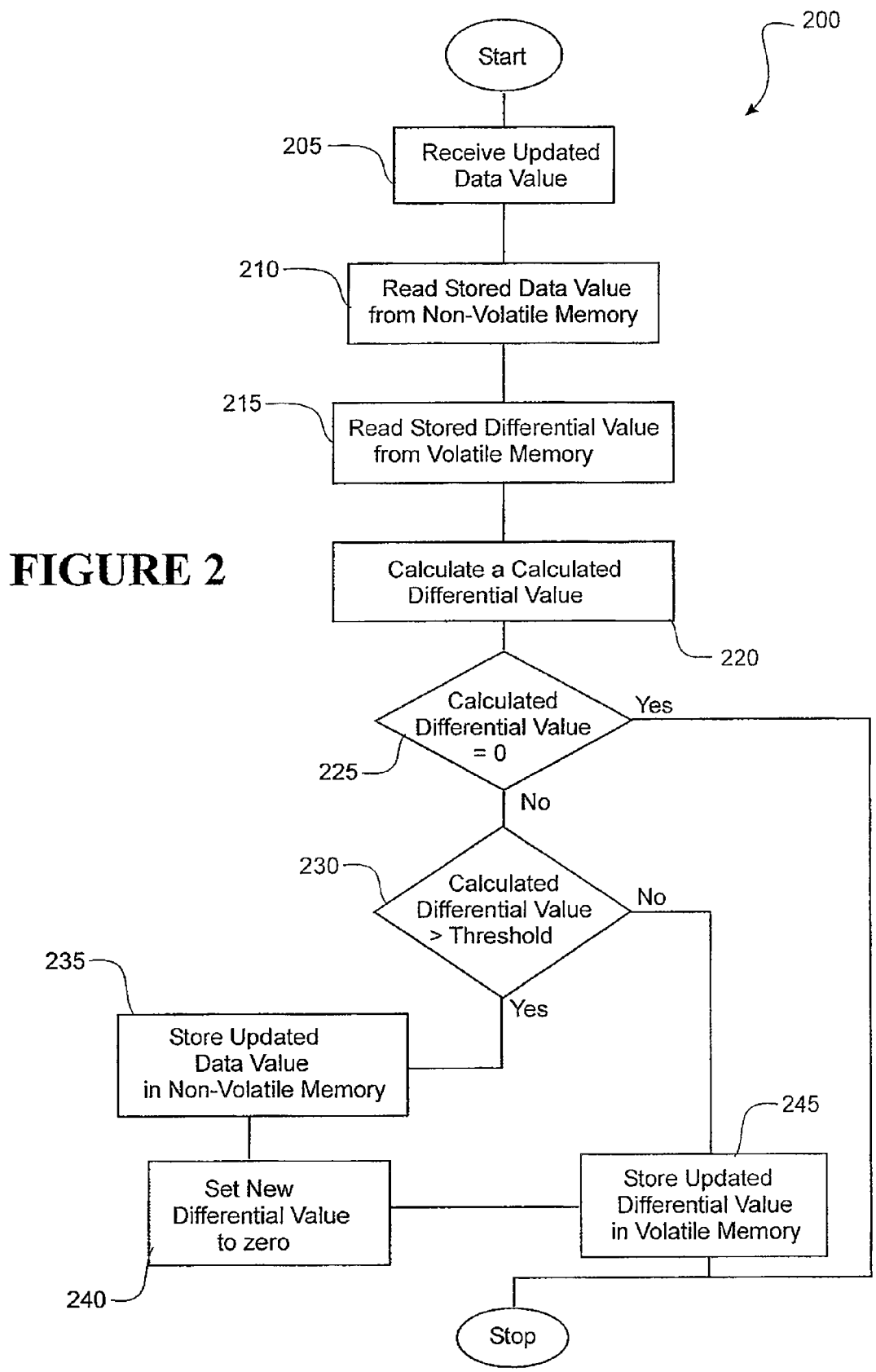
FIG. 2 shows a preferred form process for updating a data value.

FIG. 2 illustrates a preferred form process 200 for updating a data value. The updated data value is first received 205, for example through input device 135.

The corresponding stored data value is read 210, from non-volatile memory 115 through I/O device 125. If there is no corresponding stored data value, then the updated data value is simply written to non-volatile memory 115.

If there is a differential value corresponding to the stored data value, then this differential value is read 215 from volatile memory 110. Calculating component 180 adds the retrieved data value to the retrieved differential value in a random access memory or cache. This sum is then subtracted from the updated data value in order to calculate 220 a calculated differential value.

Comparator 185 checks whether 225 the calculated differential value is 0, this means that the updated data value is the same as the sum of the stored data value and the stored differential value. If the calculated differential value is 0, then nothing further is needed.

If 230 the comparator 185 determines that the calculated differential value is greater than a predefined threshold differential value, then the updated data value is stored 235 in non-volatile memory 115. The new differential value is set 240 to zero and the updated differential value is stored 245 in volatile memory.

If 230 the calculated differential value is not greater than a threshold value as shown in FIG. 2, the updated differential value is stored 245 in volatile memory.

Figure 3:
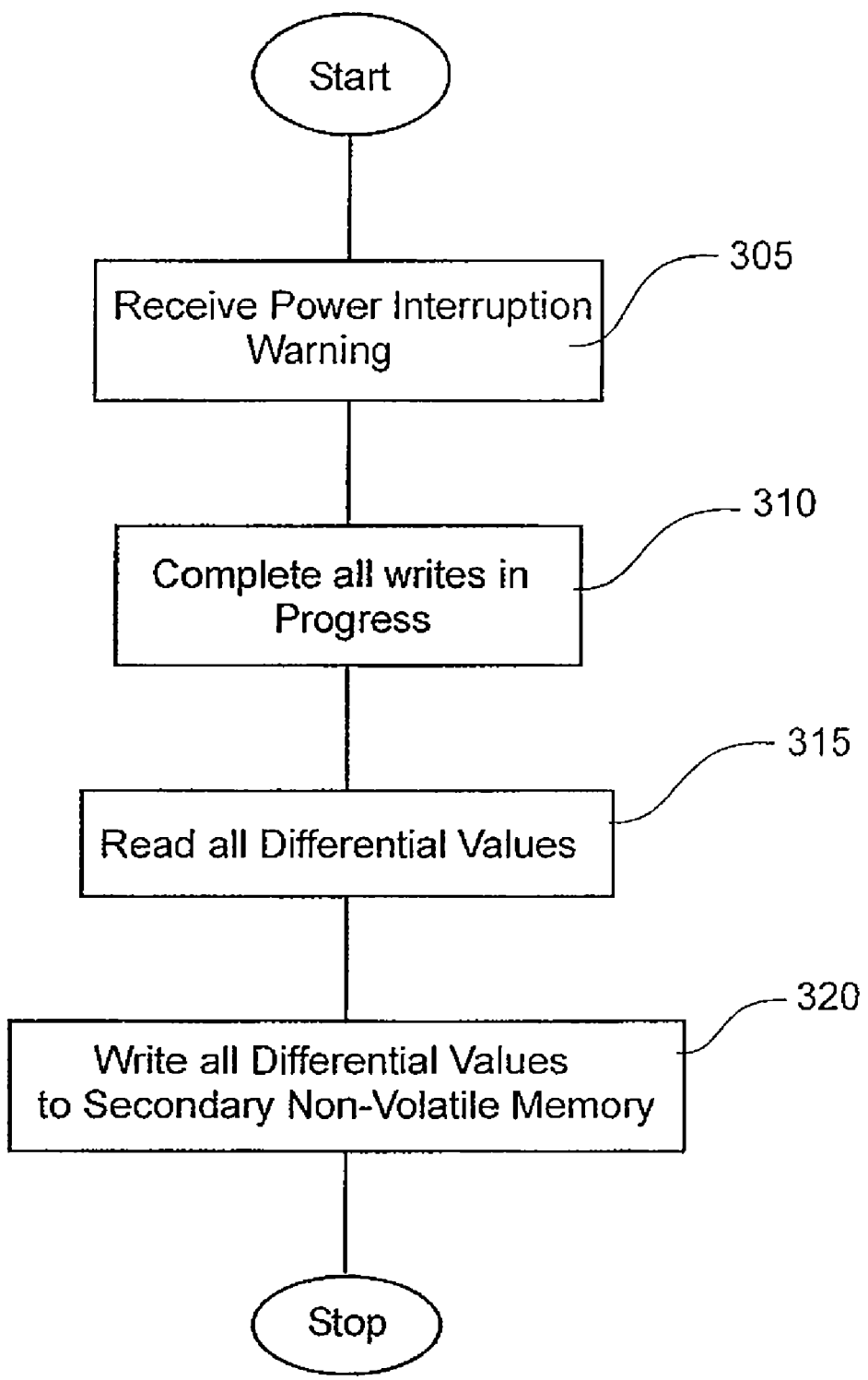
FIG. 3 shows a preferred form process for preserving differential values.

FIG. 3 shows a preferred form process for preserving the differential values 150 stored in volatile memory. It is typical to receive a warning of imminent power interruption to the system. One such warning is when the system detects a fall in voltage. This leads to an alert providing a finite amount of time before power is interrupted to the system 100. As soon as the system receives the warning 305, the system completes 310 all write operations in progress. The system reads 315 all differential values from volatile memory and writes 320 the retrieved differential values to secondary non-volatile memory.

The above systems are particularly suited to maintaining data values that change frequently by single amounts. Typical applications of the above technology include utility meters and moisture measurement.

The techniques described above go some way toward providing the benefit of extending the life of a FLASH MEMORY/EEPROM, thereby increasing the lifespan of the product in which the non-volatile memory is employed and reducing maintenance servicing requirements and cost. A further benefit is that the system is able to provide processing time benefits as non-volatile memory is typically slower to write to than volatile memory. By reducing the number of writes needed to a non-volatile memory, this has potential to speed up applications as well as extend non-volatile memory life.

Whenever a value is updated, the value stored in non-volatile memory is only updated if the difference between the currently stored value and the new value is greater than the maximum value that can be stored in any differential value. This technique is flexible in that differential values or threshold values for differential values can be defined to be any size depending on the resource and strengths of the system, the characteristics of the data that is stored and the time required or available to store differential values in secondary non-volatile memory when a power fail event occurs. The technique can also be extended to cache data values completely in volatile memory if it is available, which has the potential to offer speed improvements.

The foregoing describes the invention including preferred forms thereof. Modifications and improvements as would be obvious to those skilled in the art are intended to be incorporated within the scope hereof, as defined by the accompanying claims.

The invention claimed is:

1. A method of updating a stored data value in a non-volatile memory, the method comprising:
   reading the stored data value from the non-volatile memory;
   reading a stored differential value from a volatile memory;
   receiving an updated data value;
   calculating a calculated differential value from the difference between the updated data value and the sum of the stored data value and the stored differential value;
   comparing the calculated differential value with a threshold differential value; and
   writing the updated data value to the non-volatile memory if the calculated differential value exceeds the threshold differential value.

2. The method of claim 1 further comprising writing the calculated differential value to volatile memory if the calculated differential value is less than the threshold differential value.

3. The method of claim 2 further comprising:
   reading one or more previously calculated differential values from the volatile memory prior to power interruption to the volatile memory; and
   writing the previously calculated differential values to the non-volatile memory.

4. The method of claim 2 further comprising:
   reading one or more previously calculated differential values from the volatile memory prior to power interruption to the volatile memory; and
   writing the previously calculated differential values to a further non-volatile memory.

5. The method of claim 1 further comprising writing a value of zero for the stored differential value on the volatile memory if the calculated differential value exceeds the threshold differential value.

6. A memory system comprising:
   a non-volatile memory in which is maintained a plurality of stored data values;
   a volatile memory in which is maintained a plurality of differential values;
   an input device configured to receive an updated data value;
   an I/O device configured to retrieve one of the stored data values from the non-violate memory and to retrieve one of the differential values from the volatile memory;
   a calculating component configured to calculate a calculated differential value from the difference between the updated data value and the sum of the retrieved stored data value and the retrieved differential value; and
   a comparator configured to compare the calculated differential value with a threshold differential value;
   the I/O device configured to write the updated data value to the non-volatile memory if the calculated differential value exceeds the threshold differential value.

\* \* \* \* \*